United States Patent [19]
Copeland et al.

[11] Patent Number: 5,304,944
[45] Date of Patent: Apr. 19, 1994

[54] HIGH FREQUENCY LINEARIZER

[75] Inventors: Wilbert Copeland, Los Angeles; Russ Reisner, Redondo Beach, both of Calif.

[73] Assignee: Hughes Aircraft Company, Los Angeles, Calif.

[21] Appl. No.: 958,619

[22] Filed: Oct. 9, 1992

[51] Int. Cl.⁵ .............................................. H03F 1/32
[52] U.S. Cl. ...................................... 330/149; 328/163
[58] Field of Search ........................ 330/149; 328/163; 375/51, 57, 58, 60; 455/50.1, 63, 295, 296, 303, 304

[56] References Cited

U.S. PATENT DOCUMENTS 4,902,983  2/1990  Fujiki et al. ........................ 330/149
5,015,965  5/1991  Katz et al. ......................... 330/149

FOREIGN PATENT DOCUMENTS 179606  8/1986  Japan ................................. 330/149

Primary Examiner—James B. Mullins
Attorney, Agent, or Firm—Gordon R. Lindeen, III; William J. Streeter; Wanda K. Denson-Low

[57] ABSTRACT

A linearizer particularly valuable for millimeter wave satellite communications is disclosed. A satellite (12) divides signal into linear (20) and nonlinear (32) paths which are converted to finline. A pair of beamlead PIN diodes (48) and a pair of varactor diodes (52) extend across the finline linear path to constitute an attenuator and phase shifter. A pair of anti-parallel Schottky diodes (60) and a pair of PIN diodes (64) extend across the nonlinear path to constitute a limiter and an attenuator. A combiner (30) combines the linear and nonlinear signals for input to an amplifier.

24 Claims, 3 Drawing Sheets

HIGH FREQUENCY LINEARIZER

FIELD OF THE INVENTION

The present invention pertains to the field of linearizers and, in particular, to a linearizer for use with high frequency communications amplifiers.

BACKGROUND OF THE INVENTION

In order to overcome the nonlinearities of amplifiers, predistortion linearizers are commonly used. The purpose of a predistortion linearizer is to introduce distortion into a signal before it is amplified. The distortion is designed to cancel out or at least minimize the distortion into the signal by nonlinearities in the amplifier. The resulting signal is therefore much cleaner. In high frequency communications applications such as in satellite communications, predistortion linearizers must be capable of operating at microwave and higher frequencies including millimeter wave frequencies, as high as V-band. Linearizers for lower frequencies are known and can operate to frequencies as high as Ku-band, although many of these lower frequency linearizers use field effect transistors in their limiters. In order to adapt these designs for still higher frequencies, e.g. millimeter wave, hybrid electromagnetic transistors would be required. However, such small geometry devices become unreliable at high power levels. As a result, there is a need for an inexpensive, passive, predistortion linearizer for high frequency signals such as millimeter waves.

SUMMARY OF THE INVENTION

The present invention uses inexpensive diodes and finline for a high frequency, passive, predistortion linearizer. In one embodiment, the invention encompasses a signal splitter for receiving a high frequency signal to be linearized, for splitting the signal into a linear portion and nonlinear portion and for transmitting the linear and nonlinear portions to a linear output port and nonlinear output port, respectively. A first transmission line has a variable attenuator and a loaded line phase shifter between the input port which is coupled to the splitter's linear output port and its own output. A second transmission line has a passive limiter and an attenuator between the input port which is coupled to the splitter's nonlinear output port and its own output. A signal combiner receives the signals from the first and second transmission line outputs and combines them to render a linearized output signal. Preferably, the first and second transmission lines comprise finline, the first and second transmission line input ports comprise waveguide to finline transitions and the attenuators, phase shifters and limiter comprise PIN diodes.

BRIEF DESCRIPTION OF THE DRAWINGS

These and other aspects of the invention will be more fully understood by reference to the following detailed description and accompanying drawings, wherein like reference numerals are used to refer to like elements and in which.

DETAILED DESCRIPTION OF THE INVENTION

Figure 1:
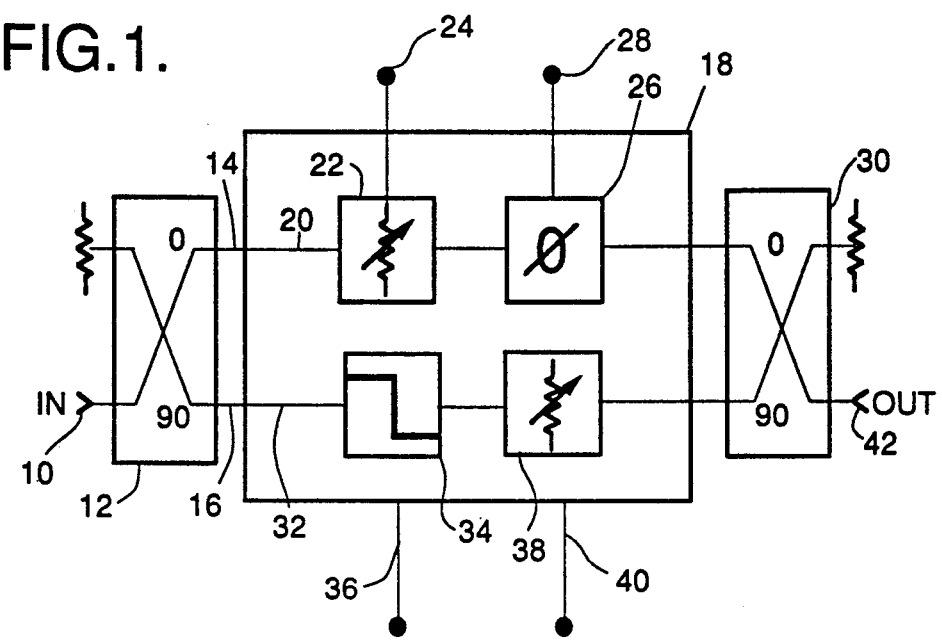
FIG. 1 is a block diagram of a linearizer constructed according to the present invention.

Referring to FIG. 1, a linearizer constructed according to the present invention has an input 10 which connects to a 180° splitter 12. A 180° splitter is preferred with magic tee couplers. For topwall or sidewall couplers, a 90° splitter is preferred. The splitter has an linear output 14 and a nonlinear phase output 16. The two outputs of the splitter couple into a waveguide section 18. The waveguide section has a first transmission line 20 which is coupled to the linear output of the splitter. The linear transmission line has a variable attenuator 22 controlled through control line 24. After the signal on linear line 20 is attenuated, it is transmitted to a phase shifter 26. The amount of phase shift from the phase shifter is controlled through a phase shifter control line 28. The signal from the first transmission line then leaves the waveguide section 18 and is coupled to a combiner 30. The nonlinear phase signal from the splitter is coupled first to a nonlinear transmission line 32 and through that transmission line to a limiter 34. The limiter is variable through a control line 36. The signal from the limiter is then conveyed to a variable attenuator 38, the attenuation of which is controlled through a control line 40. From the variable attenuator, the second transmission path is conveyed to the combiner 30 which combines the linear and nonlinear signals and conveys them to an output port 42. The predistorted linearizer output is coupled to an amplifier for which the linearizer has been tuned, preferably using control inputs 24, 28, 36 and 40. In a communications satellite, the amplifier is typically coupled to an antenna which transmits the amplified signals to Earth.

Figure 2:
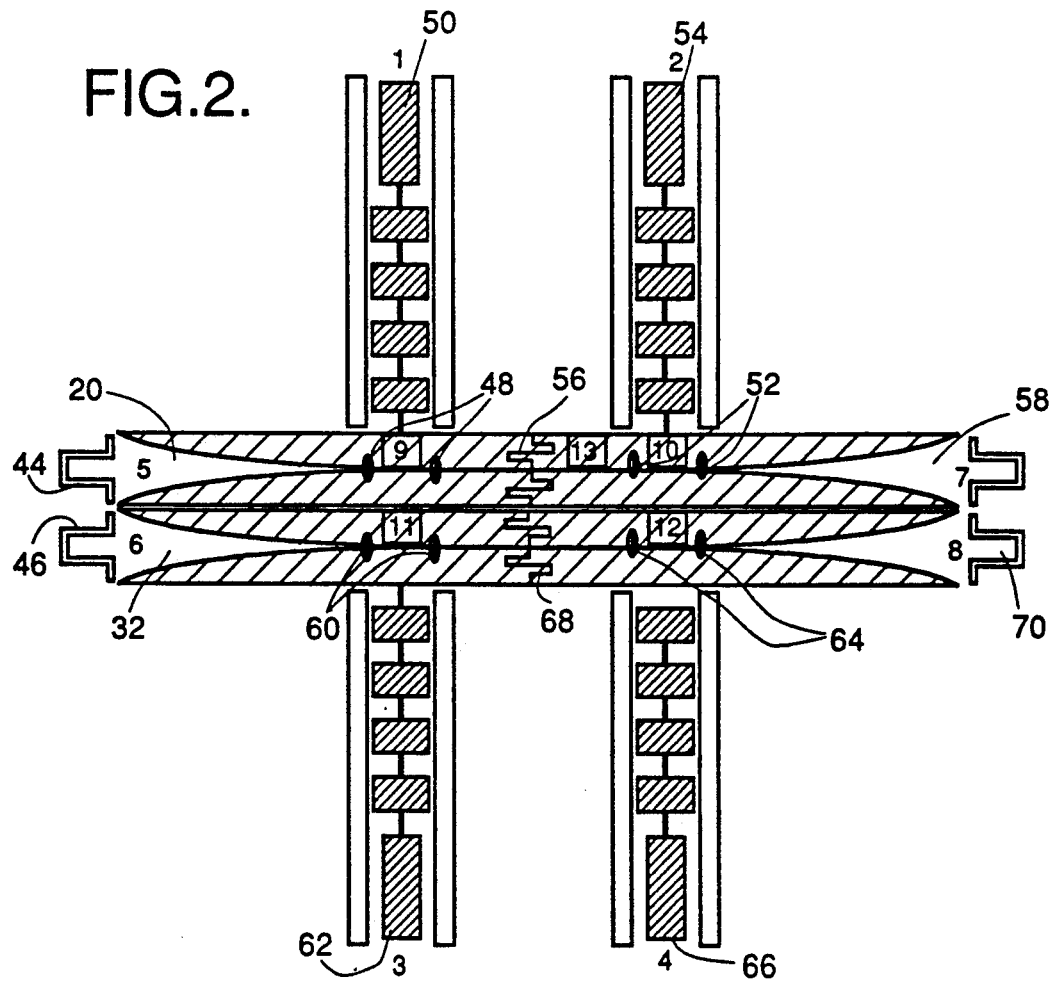
FIG. 2 shows a finline printed wiring board for implementing the first and second transmission paths of the present invention.

Referring to FIG. 2, the waveguide section 18 is preferably implemented in finline. The printed wiring board of FIG. 2 has a first transmission path 20 and a second transmission path 32 which receives signals from the splitter, (FIG. 1). The signals enter the printed wiring board from the splitter through waveguide to finline transitions 44, 46 one for each of the signal paths. The first transmission line 20 is the linear branch. The linear branch has a pair of beamlead PIN diodes 48 which are mounted across the finline slot to serve as a variable attenuator. The attenuation is a function of the DC current supplied through a low pass filter 50. Following the variable attenuator is a pair of varactor diodes 52 across the finline path that serve as a loaded line phase shifter. A DC voltage bias 54 controls the operation of the varactor diodes. A DC block 56 on the printed wiring board separates the DC bias for the attenuator from the DC bias for the phase shifter. The first transmission path ends with a finline to waveguide transition 58 which feeds into the coupler 30 of FIG. 1. The second transmission path accepts a signal of equal amplitude through its waveguide to finline transition and conducts this signal first to a pair of anti-parallel Schottky diodes (60) mounted across the finline slot to serve as a passive limiter. The passive limiters are controlled through a DC bias source 62. Following the limiter, is a second pair of beamlead PIN diodes 64 which serve as an attenuator for the second transmission path, controlled through a DC bias and low pass filter 66. A second DC block 68 isolates the bias for the limiter from the bias for the variable attenuator. A second finline to waveguide transition 70 at the end of the second transmission path conveys the signal to the coupler 30 of FIG. 1.

Figure 3:
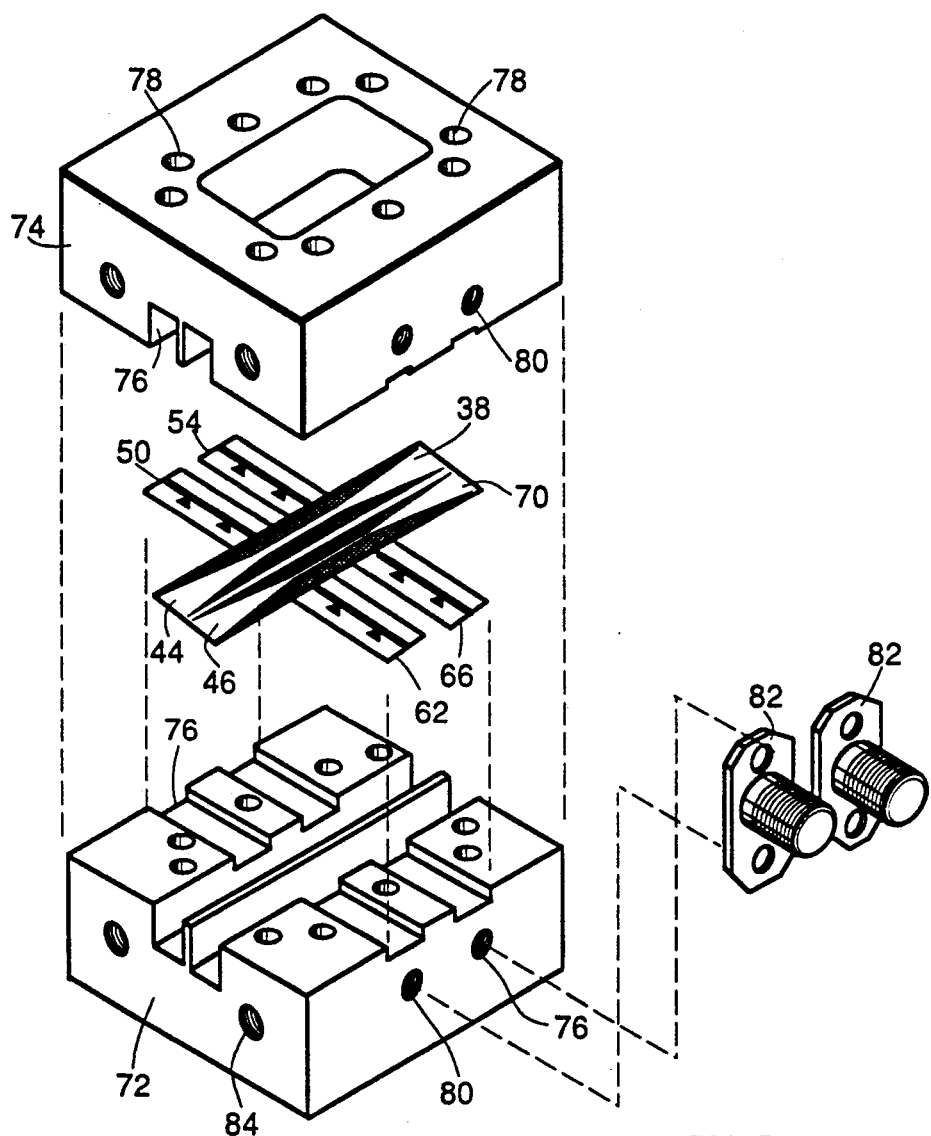
FIG. 3 shows a split block waveguide housing for the printed wiring board of FIG. 2.
Figure 4:
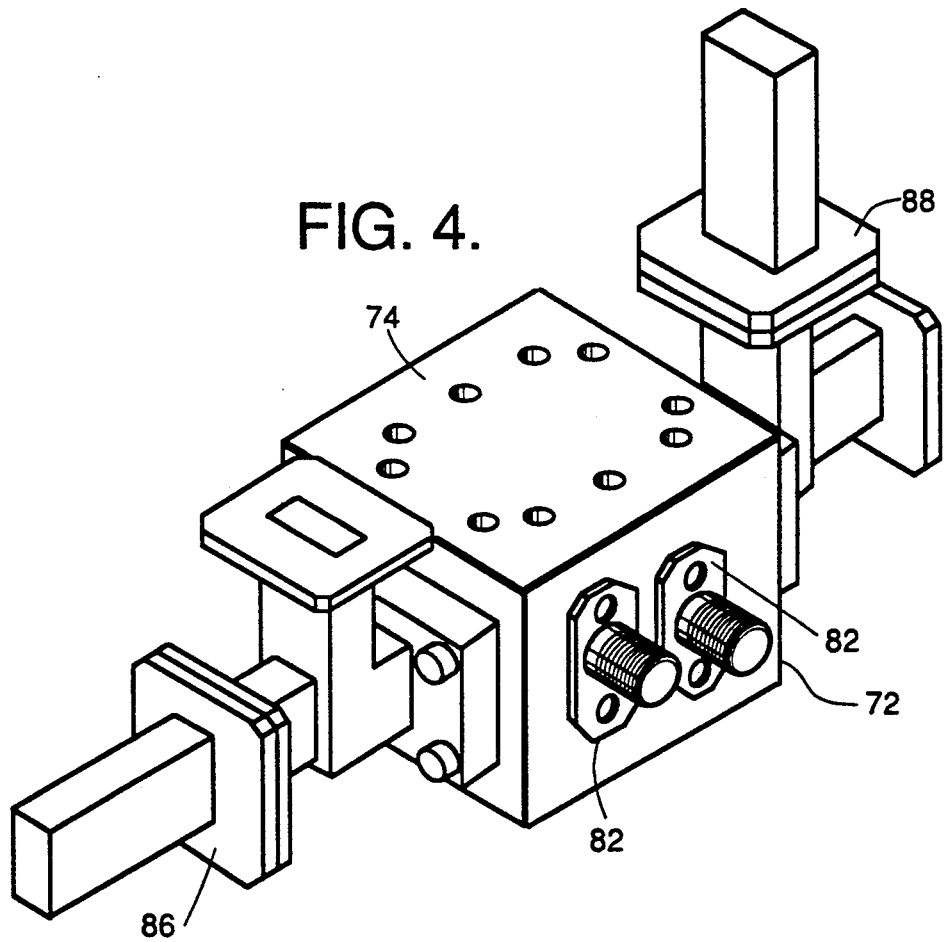
FIG. 4 shows a drawing of a linearizer constructed according to the principles depicted in diagrammatic form in FIG. 1.

FIG. 3 shows a split block waveguide housing suitable for the printed wiring board of FIG. 2. The block housing is preferably constructed of machined aluminum which is then gold plated. The split block housing has a bottom portion 72 and a top portion 74. Both portions have machined grooves 76 for receiving the printed wiring board of FIG. 2. The printed wiring board is placed into the machined grooves in the bottom portion of the housing and the top portion of the housing is fastened to the bottom portion of the housing, preferably through holes 78 using screws (not shown). The block has a set of screw holes 80 on one face for receiving bias current receptacles 82 to couple with the DC bias input portions of the printed wiring board. The opposite face of the housing (not shown) has a similar set of holes for the other two DC bias inputs. A second set of screw holes 84 on the adjacent two sides of the split block housing allow a splitter to be coupled to the input side of the printed wiring board and a coupler to be coupled to the opposite output side of the printed wiring board. FIG. 4 shows the split block housing assembled with a printed wiring board inside and with a magic tee splitter 86 and magic tee coupler 88 fastened on either side. While the linearizer is shown using magic tee splitters and combiners, a variety of different types of splitters and combiners known in the art can be used within the scope of the present invention including finline, topwall and sidewall couplers. the phase relationship between the linear and nonlinear signals can be varied to suit particular applications.

The present invention provides highly reliable results for millimeter waves. Waveguide couplers have nearly ideal performance characteristics. Beamlead diodes and finline are also very reliable and lower in cost than active components. The linearizer after construction can be tuned to inject the appropriate amount of predistortion required to linearize a particular amplifier using the DC bias input receptacles 82. Later, the linearizer can easily be returned using the DC bias inputs to match other amplifiers or to compensate for changes in the performance of the amplifier for which it was turned. While the invention has been described in only one embodiment, it will be apparent to those skilled in the art that a variety of modifications and adaptations can be made without departing from the scope of the present invention. The invention can be adapted for a variety of different frequencies by changing the type of transmission paths and couplers and it can be tuned to match solid state and tube amplifiers. While it is preferred that the linearizer bias inputs be set once and fixed at one setting for one amplifier, the bias inputs can also be varied to adapt to changes in amplifiers and in changes in the performance of a single amplifier. The invention has been described as a predistortion linearizer, the output of which is coupled to an amplifier. However, the principles of the present invention can also be applied to signals after amplification to linearize an amplified signal, if required. It is not intended by describing only the one embodiment above to limit the scope of the invention to that one embodiment, but only by the appended claims.

What is claimed is:

1. A predistortion amplifier linearizer comprising:
   a signal splitter for receiving a signal to be linearized, for splitting the signal into a linear portion and a nonlinear portion and for transmitting the linear and nonlinear portions to a linear output port and a nonlinear output port, respectively;
   a first finline transmission line having an input coupled to the linear output port and an output, a first finline path between the input and the output, a first attenuator having a first diode element coupled to the finline path, and a phase shifter having a second diode element coupled to the finline path;
   a second finline transmission line having an input coupled to the nonlinear output port and an output, a second finline path between the input and the output, a passive limiter having a third diode element coupled to the finline path, and a second attenuator having a fourth diode element coupled to the finline path; and
   a signal combiner for receiving the signals from the first and second transmission line outputs and combining them to render a predistorted output signal.

2. The linearizer of claim 1 wherein the signal splitter and combiner each comprise topwall waveguide couplers and wherein the linear and nonlinear portions are 90° out of phase.

3. The linearizer of claim 1 wherein the signal splitter and combiner comprise a magic tee splitter and a magic tee combiner, respectively, and wherein the linear and nonlinear portions are 180° out of phase.

4. The linearizer of claim 1 wherein the signal splitter and combiner each comprise a sidewall coupler.

5. The linearizer of claim 1 wherein the first and second transmission line inputs comprise waveguide to finline transition and the first and second transmission line outputs comprise finline to waveguide transitions.

6. The linearizer of claim 5 wherein the first and second transmission lines are comprised of a printed wiring board and further comprising a split block waveguide housing for containing the printed wiring board.

7. The linearizer of claim 1 wherein the first diode element comprises at least one beamlead PIN-diode.

8. The linearizer of claim 7 comprising a low pass filter for driving the beamlead PIN-diode.

9. The linearizer of claim 1 wherein the second diode element comprises at least one varactor diode.

10. The linearizer of claim 9 comprising a DC bias power supply for controlling the varactor diode.

11. The linearizer of claim 1 wherein the first transmission line comprises a DC block for isolating DC between the variable attenuator and the loaded line phase shifter.

12. The linearizer of claim 1 wherein the third diode element comprises anti-parallel Schottky diodes.

13. The linearizer of claim 12 comprising a DC bias supply for driving the Schottky diodes.

14. The linearizer of claim 1 wherein the fourth diode element comprises at least one PIN diode.

15. The linearizer of claim 1 comprising at least one lowpass filter for driving at least one of the diode elements.

16. A predistortion amplifier linearizer comprising:
   a signal splitter for receiving a signal to be linearized, for splitting the signal into a linear portion and nonlinear portion and for transmitting the linear and nonlinear portions to a linear output port and a nonlinear output port respectively;
   a first transmission line having an input coupled to the linear output port and an output and a first transmission path between the input and the output;

a first attenuator having a first diode element directly connected to the first transmission path;

a phase shifter having a second diode element directly connected to the first transmission path;

a second transmission line having an input coupled to the nonlinear output port and an output and a second transmission path between the input and the output;

a passive limiter having a third diode element directly connected to the second transmission path;

a second attenuator having a fourth diode element directly connected to the second transmission path;

a signal combiner for receiving the signals form the first and second transmission line outputs and combining them to render a predistorted output signal.

17. The linearizer of claim 16 wherein the signal splitter and combiner each comprise topwall waveguide couplers and wherein the linear and nonlinear portions are 90 degrees out of phase.

18. The linearizer of claim 16 wherein the signal splitter and combiner comprise a magic tee splitter and a magic tee combiner, respectively, and wherein the linear and nonlinear portions are 180 degrees out of phase.

19. The linearizer of claim 16 wherein the signal splitter and combiner each comprise a sidewall coupler.

20. The linearizer of claim 16 wherein the first diode element comprises at least one beamlead PIN-diode having a first side directly connected to the first transmission line.

21. The linearizer of claim 16 wherein the second diode element comprises at least one varactor having a first side directly connected to the first transmission line.

22. The linearizer of claim 16 wherein the first transmission line comprises a DC block for isolating DC between the attenuator and the phase shifter.

23. The linearizer of claim 16 wherein the third diode element comprises anti-parallel Schottky diodes having a first side directly connected to the second transmission line.

24. The linearizer of claim 16 wherein the fourth diode element comprises at least one PIN-diode having a first side directly connected to the second transmission lines.

* * * * *